(12) United States Patent
Takeda

(10) Patent No.: US 11,410,959 B2
(45) Date of Patent: Aug. 9, 2022

(54) SEMICONDUCTOR MODULE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shun Takeda, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/191,312

(22) Filed: Mar. 3, 2021

(65) Prior Publication Data

US 2022/0093552 A1  Mar. 24, 2022

(30) Foreign Application Priority Data

Sep. 24, 2020 (JP) .............................. JP2020-160231

(51) Int. Cl.
*H01L 23/00* (2006.01)
*H01L 23/31* (2006.01)
(Continued)

(52) U.S. Cl.
CPC .......... *H01L 24/32* (2013.01); *H01L 23/3107* (2013.01); *H01L 23/34* (2013.01);
(Continued)

(58) Field of Classification Search
CPC ..... H01L 24/32; H01L 23/3107; H01L 23/34; H01L 24/37; H01L 24/40; H01L 24/73;
(Continued)

(56) References Cited

U.S. PATENT DOCUMENTS

2013/0015468 A1  1/2013 Kikuchi
2017/0154834 A1  6/2017 Tonedachi et al.
2019/0237381 A1  8/2019 Kawashima

FOREIGN PATENT DOCUMENTS

JP  2017-108130 A  6/2017
JP  2017-220609 A  12/2017

*Primary Examiner* — Robert G Bachner
(74) *Attorney, Agent, or Firm* — Foley & Lardner LLP

(57) ABSTRACT

A semiconductor module includes a substrate, a first semiconductor device, a second semiconductor device, a first wiring, a second wiring, a first intermediate layer, a second intermediate layer, and a third wiring. The first semiconductor device is provided on the substrate. The first semiconductor device has a first surface facing the substrate and has a second surface on a side opposite to the first surface. The second semiconductor device is adjacent to the first semiconductor device and is provided on the substrate. The second semiconductor device has a first surface facing the substrate and has a second surface on a side opposite to the first surface. The first wiring is provided on the second surface of the first semiconductor device and is coupled to the second surface of the first semiconductor device. The second wiring is provided on the second surface of the second semiconductor device and is coupled to the second surface of the second semiconductor device. The first intermediate layer is provided on the first wiring and is coupled to the first wiring. The second intermediate layer is provided on the second wiring and is coupled to the second wiring. The third wiring has a plate part on the first intermediate layer and on the second intermediate layer. The plate part is coupled to the first intermediate layer and to the second intermediate layer. The third wiring has a pillar part or a wall part between the plate part and the substrate. The third wiring has thermal conductivity due to coupling of the plate part and the substrate via the pillar part or the wall part.

17 Claims, 4 Drawing Sheets

(51) Int. Cl.
*H01L 23/34* (2006.01)
*H01L 25/07* (2006.01)
(52) U.S. Cl.
CPC .............. *H01L 24/37* (2013.01); *H01L 24/40* (2013.01); *H01L 24/73* (2013.01); *H01L 25/072* (2013.01); *H01L 2224/40137* (2013.01); *H01L 2224/40225* (2013.01)
(58) Field of Classification Search
CPC ......... H01L 25/072; H01L 2224/40137; H01L 2224/40225
See application file for complete search history.

SEMICONDUCTOR MODULE

CROSS-REFERENCE TO RELATED APPLICATION(S)

This application is based upon and claims the benefit of priority from Japanese Patent Application No. 2020-160231, filed Sep. 24, 2020, the entire contents of which are incorporated herein by reference.

FIELD

Embodiments described herein relate generally to a semiconductor module.

BACKGROUND

Existing semiconductor power modules are mounted with a semiconductor device on, for example, a ceramic substrate via solder. The ceramic substrate has a copper foil attached on each of top and back surfaces. The semiconductor power module can dissipate heat from the ceramic substrate. Dissipating more heat that is generated from the semiconductor device can improve reliability of the semiconductor power module.

DETAILED DESCRIPTION

Figure 1:
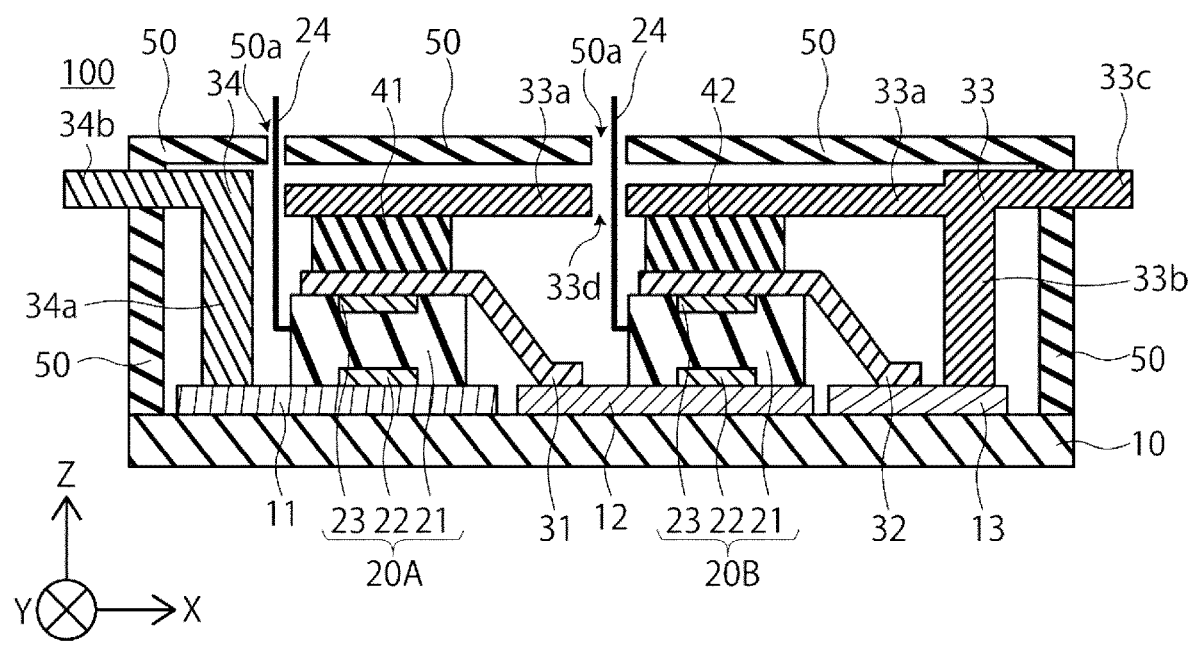
FIG. 1 is a sectional view of a semiconductor module of at least one embodiment.

At least one embodiment provides a semiconductor module having high reliability.

In general, according to at least one embodiment, a semiconductor module includes a substrate, a first semiconductor device, a second semiconductor device, a first wiring, a second wiring, a first intermediate layer, a second intermediate layer, and a third wiring. The first semiconductor device is provided on the substrate. The first semiconductor device has a first surface that faces the substrate and has a second surface on a side opposite to the first surface. The second semiconductor device is adjacent to the first semiconductor device and is provided on the substrate. The second semiconductor device has a first surface that faces the substrate and has a second surface on a side opposite to the first surface. The first wiring is provided on the second surface of the first semiconductor device and is coupled to the second surface of the first semiconductor device. The second wiring is provided on the second surface of the second semiconductor device and is coupled to the second surface of the second semiconductor device. The first intermediate layer is provided on the first wiring and is coupled to the first wiring. The second intermediate layer is provided on the second wiring and is coupled to the second wiring. The third wiring has a plate part on the first intermediate layer and on the second intermediate layer. The plate part is coupled to the first intermediate layer and to the second intermediate layer. The third wiring has a pillar part or a wall part between the plate part and the substrate. The third wiring has thermal conductivity due to coupling of the plate part and the substrate via the pillar part or the wall part.

Hereinafter, embodiments of the present disclosure will be described with reference to the drawings. It is noted that, for convenience of illustration and easy understanding, scales, ratios of vertical and lateral dimensions, and the like, are appropriately changed and exaggerated from those of actual elements, in the drawings attached to the specification of this disclosure.

The following describes embodiments with reference to the drawings. It is noted that corresponding or similar elements and the like are given the same or similar reference signs.

In this specification, corresponding or similar elements and the like are given the same reference signs, and descriptions are not duplicated depending on the case.

In this specification, in order to show positional relationships of parts and elements, an upper direction in the drawing is defined as an "upper side", whereas a lower direction in the drawing is defined as a "lower side". In this specification, the concepts of the words "upper side" and "lower side" may not be intended to show relationships with a direction of gravity.

This specification uses the words such as "parallel", "orthogonal", and "same", the values of length, angle, and so on, and other factors for determining shape, geometric conditions, and degrees of the geometric conditions. These are not understood in a strict sense, but are understood as having such ranges as to enable achieving similar functions.

First Embodiment

Figure 2:
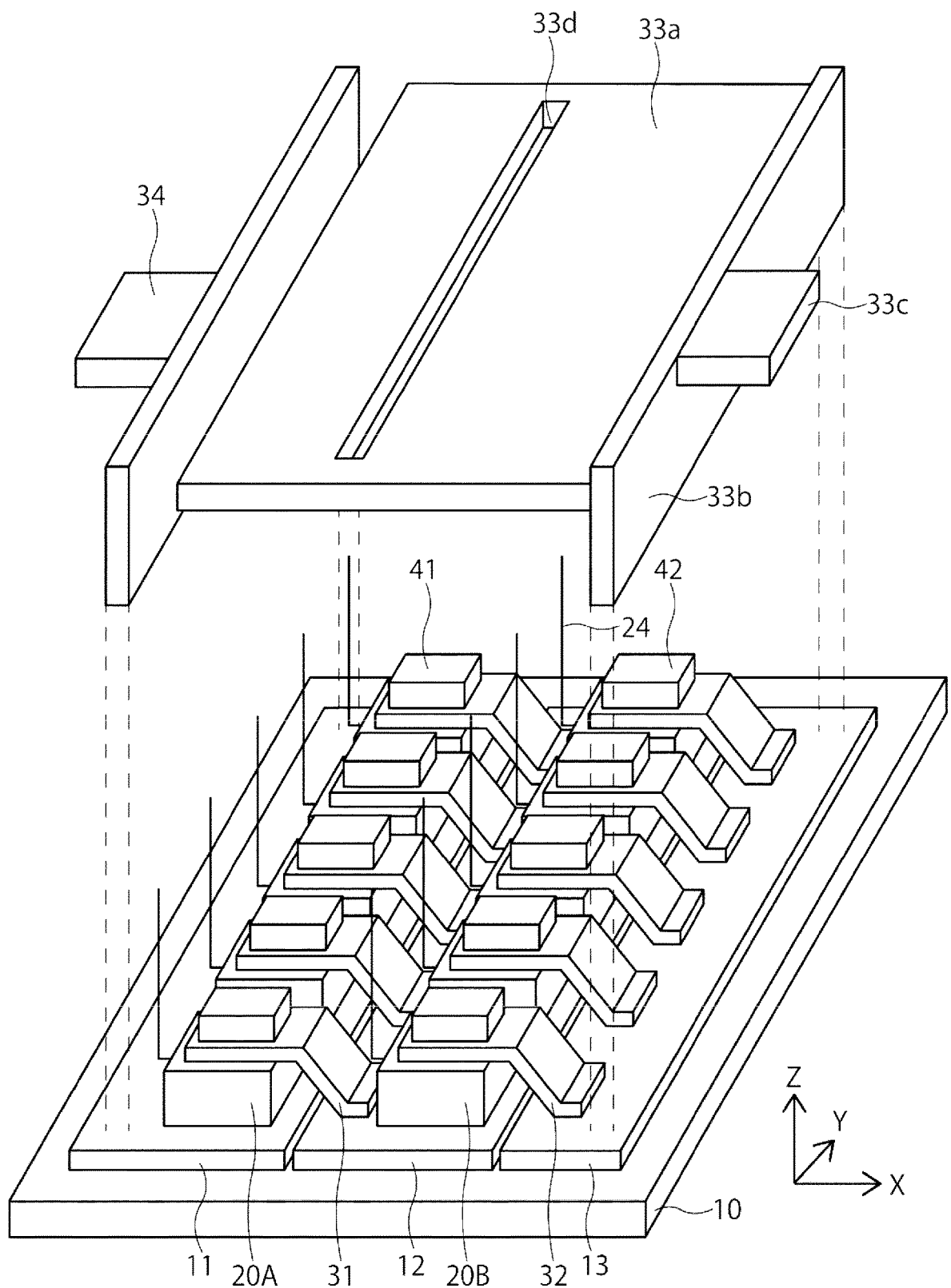
FIG. 2 is a perspective development view of the semiconductor module of at least one embodiment.

A first embodiment relates to a semiconductor module and semiconductor devices. More specifically, the first embodiment relates to a semiconductor power module. FIG. 1 shows a sectional view of a semiconductor module 100 of the embodiment. FIG. 2 shows a perspective development view of the semiconductor module 100 of at least one embodiment. FIGS. 1 and 2 show main parts of the semiconductor module 100. An X direction, a Y direction, and a Z direction cross each other and are preferably orthogonal to each other. The semiconductor module 100 may be used in, for example, a power converter of an inverter or the like such as in a wind turbine generator system, a photovoltaic power system, or a vehicle.

The semiconductor module 100 has a substrate 10, a first semiconductor device 20A, a second semiconductor device 20B, a first wiring 31, a second wiring 32, a third wiring 33, a fourth wiring 34, a first intermediate layer 41, a second intermediate layer 42, and an exterior material 50. The first semiconductor device 20A and the second semiconductor device 20B are disposed in a case configured with the substrate 10 and the exterior material 50.

The substrate 10 is an insulating support body. Wiring layers 11, 12, and 13 are provided on a surface of the substrate 10. The substrate 10 preferably may include a ceramic layer or an insulating thermally conductive resin layer, or both. The insulating thermally conductive resin layer preferably contains filler. The filler is, for example, one or more kinds selected from the group consisting of boron nitride, alumina, aluminum nitride, silicon nitride, silicon carbide, and the like. The substrate 10 is a member which dissipates heat that is generated by the first semiconductor device 20A or the second semiconductor device 20B, to the outside. The substrate 10 preferably has high thermal conductivity. The substrate 10 preferably has a thermal conductivity of 3 W/mK or greater. The substrate 10 preferably has a dielectric strength of 17 kV/ram or greater. The first semiconductor device 20A and the second semiconductor device 20B are respectively provided on the wiring layers 11 and 12 on the substrate 10.

The wiring layers 11, 12, and 13 are conductive layers containing Cu or Al. The wiring layers 11, 12, and 13 also extend in the Y direction. The wiring layers 11, 12, and 13 are separated from each other on the substrate 10. The first semiconductor device 20A and the fourth wiring 34 are provided on the wiring layer 11 and are electrically connected to each other. The second semiconductor device 20B and the first wiring 31 are provided on the wiring layer 12 and are electrically connected to each other. The second wiring 32 and the third wiring 33 are provided on the wiring layer 13 and are electrically connected to each other. The members are preferably joined to each other by using solder or conductive paste. The joining material that is used at such as the joint between the wiring layer 11 and the first semiconductor device 20A, is not shown in the drawings.

The semiconductor module 100 has semiconductor devices. In FIG. 1, the first semiconductor device 20A is positioned on the left of the semiconductor module 100, and the second semiconductor device 20B is positioned on the right of the semiconductor module 100. The first semiconductor device 20A and the second semiconductor device 20B are adjacent to each other. The semiconductor devices are mounted in the X direction and the Y direction. For example, 10 or more semiconductor devices are provided in one semiconductor module. Each of the first semiconductor device 20A and the second semiconductor device 20B may be an insulated gate bipolar transistor (IGBT) or a MOSFET. The first semiconductor device 20A and the second semiconductor device 20B preferably have the same semiconductor elements.

The semiconductor element of the first semiconductor device 20A of the first embodiment is sealed with a sealing resin 21. A surface facing the substrate 10 of the first semiconductor device 20A is a first surface. A surface on a side opposite to the first surface of the first semiconductor device 20A is a second surface. The first surface of the first semiconductor device 20A faces the substrate 10. The first surface of the first semiconductor device 20A is coupled to the wiring layer 11. The first semiconductor device 20A has a first electrode 22 and a second electrode 23. The first surface of the first semiconductor device 20A is provided with the first electrode 22, and the first electrode 22 is electrically connected to the wiring layer 11. The wiring layer 11 is electrically connected also to the fourth wiring 34. The second surface of the first semiconductor device 20A is coupled to the first wiring 31. The second surface of the first semiconductor device 20A is provided with the second electrode 23, and the second electrode 23 is electrically connected to the first wiring 31. The first electrode 22 of the first semiconductor device 20A may be, for example, an emitter electrode or a source electrode, whereas the second electrode 23 is, for example, a collector electrode or a drain electrode, or vice versa. A third electrode 24 for controlling extends from the first semiconductor device 20A. The third electrode 24 is, for example, a gate electrode.

The semiconductor element of the second semiconductor device 20B of the first embodiment is sealed with a sealing resin 21. A surface facing the substrate 10 of the second semiconductor device 20B is a first surface. A surface on a side opposite to the first surface of the second semiconductor device 20B is a second surface. The first surface of the second semiconductor device 20B faces the substrate 10. The first surface of the second semiconductor device 20B is coupled to the first wiring 31. The second semiconductor device 20B has a first electrode 22 and a second electrode 23. The first surface of the second semiconductor device 20B is provided with the first electrode 22, and the first electrode 22 is electrically connected to the wiring layer 12. The wiring layer 12 is electrically connected also to the first wiring 31. The second surface of the second semiconductor device 20B is coupled to the second wiring 32. The second surface of the second semiconductor device 20B is provided with the second electrode 23, and the second electrode 23 is electrically connected to the second wiring 32. The first electrode 22 of the second semiconductor device 20B is, for example, an emitter electrode or a source electrode, whereas the second electrode 23 is, for example, a collector electrode or a drain electrode, or vice versa. A third electrode 24 for controlling extends from the second semiconductor device 20B. The third electrode 24 is, for example, a gate electrode.

The first semiconductor device 20A and the second semiconductor device 20B are coupled in series. When multiple first semiconductor devices 20A are provided in the Y direction, as shown in FIG. 2, the first semiconductor devices 20A arranged in the Y direction are coupled in parallel. When multiple second semiconductor devices 20B are provided in the Y direction, as shown in FIG. 2, the second semiconductor devices 20B arranged in the Y direction are coupled in parallel.

The second electrode 23 of the first semiconductor device 20A and the first electrode 22 of the second semiconductor device 20B are electrically connected to each other via the first wiring 31, or more precisely, via the first wiring 31 and the wiring layer 12.

The first wiring 31 is a conductive member that electrically connects the second electrode 23 of the first semiconductor device 20A and the first electrode 22 of the second semiconductor device 20B to each other. The first wiring 31 is a conductive member that is made of metal composed mainly of Cu or Al.

The first wiring 31 extends from the second electrode 23 of the first semiconductor device 20A to the wiring layer 12. The first wiring 31 is coupled to a first semiconductor device 20A side of the wiring layer 12. The wiring layer 12 may be coupled to an external terminal of the semiconductor module 100. The external terminal is known as a "collector and emitter terminal." The wiring such as the first wiring 31 may be provided with a leg that comes into surface contact with the wiring layer 12 in a facing manner, and this wiring may be ultrasonically bonded to the wiring layer 12. Ultrasonic bonding can provide stronger bonding than solder bonding or the like. It is preferable to also employ ultrasonic bonding to joining between the second wiring 32 or the like and other member.

The second wiring 32 is a conductive member that electrically connects the second electrode 23 of the second semiconductor device 20B and the third wiring 33 to each other. The second wiring 32 is a conductive member that is made of metal composed mainly of Cu or Al. The second wiring 32 is coupled to the third wiring 33 via the wiring layer 13.

The first intermediate layer 41 is provided on the first wiring 31 and is coupled thereto. The first intermediate layer 41 is positioned between the first wiring 31 and the third wiring 33. The first intermediate layer 41 has superior thermal conductivity. The first intermediate layer 41 preferably has a thermal conductivity of 3 W/mK or greater. The first intermediate layer 41 is thermally coupled to the second electrode 23 of the first semiconductor device 20A. The first intermediate layer 41 is a heat transfer path that transfers heat between the first semiconductor device 20A and the third wiring 33. The first intermediate layer 42 is thermally also coupled to the third wiring 33. The first wiring 31 and the third wiring 33 are not electrically connected to each other via the first intermediate layer 41, because they would be short-circuited when being electrically connected to each other via the first intermediate layer 41. The first intermediate layer 41 preferably has a dielectric strength of 17 kV/mm or greater in a direction from the first wiring 31 to the third wiring 33. The first intermediate layer 41 is an insulating member or includes a layer having dielectric strength in a direction for stacking the first wiring 31 and the first intermediate layer 41. The first intermediate layer 41 preferably includes a ceramic layer or an insulating thermally conductive resin layer, or both. In order to facilitate heat transfer in the path through the first intermediate layer 41, the thermal conductivity [W/mK] of the first intermediate layer 41 is preferably higher than the thermal conductivity [W/mK] of the first semiconductor device 20A.

The second intermediate layer 42 is provided on the second wiring 32 and is coupled thereto. The second intermediate layer 42 is positioned between the second wiring 32 and the third wiring 33. The second intermediate layer 42 has superior thermal conductivity. The second intermediate layer 42 preferably has a thermal conductivity of 3 W/mK or greater. The second intermediate layer 42 is thermally coupled to the second electrode 23 of the second semiconductor device 20B. The second intermediate layer 42 is a heat transfer path that transfers heat between the second semiconductor device 20B and the third wiring 33. The second intermediate layer 42 is thermally coupled also to the third wiring 33. The second wiring 32 and the third wiring 33 are preferably not electrically connected to each other via the second intermediate layer 42. The second intermediate layer 42 preferably has a dielectric strength of 17 kV/mm or greater in a direction from the second wiring 32 to the third wiring 33. It is preferable that the second intermediate layer 42 is an insulating member or includes a layer having dielectric strength in a direction for stacking the second wiring 32 and the second intermediate layer 42. The second intermediate layer 42 preferably includes a ceramic layer or an insulating thermally conductive resin layer, or both. In order to facilitate heat transfer in the path through the second intermediate layer 42, the thermal conductivity [W/mK] of the second intermediate layer 42 is preferably higher than the thermal conductivity [W/mK] of the second semiconductor device 20B.

The third wiring 33 has a plate part 33a on the first intermediate layer 41 and the second intermediate layer 42 and has a pillar part 33b or a wall part 33b between the plate part 33a and the substrate 10. The plate part 33a is coupled to the first intermediate layer 41 and to the second intermediate layer 42. The plate part 33a of the third wiring 33 extends in the X-Y plane direction in such a manner as to cover the first semiconductor device 20A and the second semiconductor device 20B. The third wiring 33 is a conductive member that is made of metal composed mainly of Cu or Al. The third wiring 33 is electrically connected to the wiring layer 13. The third wiring 33 has a terminal part 33c that is exposed to the outside of the semiconductor module 100 and that functions as a first external electrode terminal, or alternatively, the third wiring 33 is coupled to an electrode terminal or a first external electrode terminal, which is not shown. The third wiring 33 is preferably thermally coupled to the first intermediate layer 41 and to the second intermediate layer 42. The third wiring 33, which is coupled to the first intermediate layer 41 and to the second intermediate layer 42, makes a loop-shaped path that transfers heat generated from the first semiconductor device 20A and the second semiconductor device 20B. The heat that is transferred from the first semiconductor device 20A and the second semiconductor device 20B to the substrate 10 is easily dissipated from an outer surface of a package that is a surface on a side opposite to the semiconductor device side of the substrate 10. Heat that is generated on the second electrode 23 side of the first semiconductor device 20A is transferred to the substrate 10 via the first semiconductor device 20A or via the first wiring and the wiring layer 12, whereby this heat is easily dissipated to the outside of the semiconductor module 100. In the condition in which the third wiring 33 is provided, the heat that is transferred to the first wiring 31 is then transferred to the substrate 10 via the plate part 33a and the pillar part 33b or the wall part 33b of the third wiring 33, whereby this heat is easily dissipated to the outside of the semiconductor module 100. Enlarging the volume of the pillar part 33b or the wall part 33b of the third wiring 33, that is, coupling a thick pillar part 33b or a thick wall part 33b to the plate part 33a, enables efficiently dissipation of heat. The pillar part 33b and the wall part 33b are conductive parts for being coupled to an external electrode terminal of the semiconductor module 100, and therefore, it is not necessary to provide an additional space for dissipating heat, to the substrate 10. An efficient heat dissipating path can be increased without providing an additional space to the substrate 10, that is, without increasing the package area. Increasing the heat dissipation path facilitates cooling the first semiconductor device 20A and the second semiconductor device 20B, whereby possibilities of malfunctions of the first semiconductor device 20A and the second semiconductor device 20B are reduced, and reliability of the semiconductor module 100 is improved. The third wiring 33 is also in contact with the exterior material 50. This structure permits heat transferred to the third wiring 33 to easily also dissipate through the exterior material 50.

The pillar part 33b of the third wiring 33 is provided in such a manner as to be separated into multiple pieces in the Y direction and be in contact with the plate part 33a. The wall part 33b of the third wiring 33 has a shape extending in the Y direction and is in contact with the plate part 33a, as shown in FIG. 2. The shape of the plate part 33a is not limited to an exact plate shape, but it may partially have a flat surface, a wave shape, or an uneven shape. The pillar part 33b can have any shape on the condition that the pillar part 33b extends from the plate part 33a in the Z direction. For example, the pillar part 33b may have a combined shape of a flat surface and a slope surface, as in the first wiring 31. As in the pillar part 33b, the wall part 33b can have any shape on the condition that the wall part 33b extends from the plate part 33a in the Z direction. Each of the plate part 33a, the pillar part 33b, and the wall part 33b may be provided with an opening, which is not shown. A plate part, a pillar part, and a wall part of other wiring are also understood in a broad sense, as in the plate part 33a, the pillar part 33b, and the wall part 33b of the third wiring 33.

The third wiring 33 preferably has an opening 33d through which the third electrode 24 of the second semiconductor device 20B passes. In FIG. 2, the opening 33d has a large rectangular shape with an opening surface that extends in the Y direction. The opening 33d through which multiple third electrodes 24 pass, as shown in FIG. 2, may be used, or an opening may be provided with respect to each third electrode 24.

The fourth wiring 34 is electrically connected to the wiring layer 11 and to the first electrode 22 of the first semiconductor device 20A. The fourth wiring 34 is a conductive member that is made of metal composed mainly of Cu or Al. The fourth wiring 34 has a pillar part 34a or a wall part 34a, and a terminal part 34b. The terminal part 34b is exposed to the outside of the semiconductor module 100 and functions as a second external electrode terminal. In the case of not having the terminal part 34b, the fourth wiring 34 is coupled to a second external electrode terminal, which is not shown.

The exterior material 50 preferably has an opening 50a through which the third electrode 24 of the first semiconductor device 20A or the third electrode 24 of the second semiconductor device 20B passes. The opening 50a of the exterior material 50 is preferably sealed with, for example, insulating resin.

The member relating to wiring may be composed of a metal material or a material having an insulating, high thermally conductive member that is attached on a part other than a surface to be electrically connected.

Second Embodiment

Figure 3:
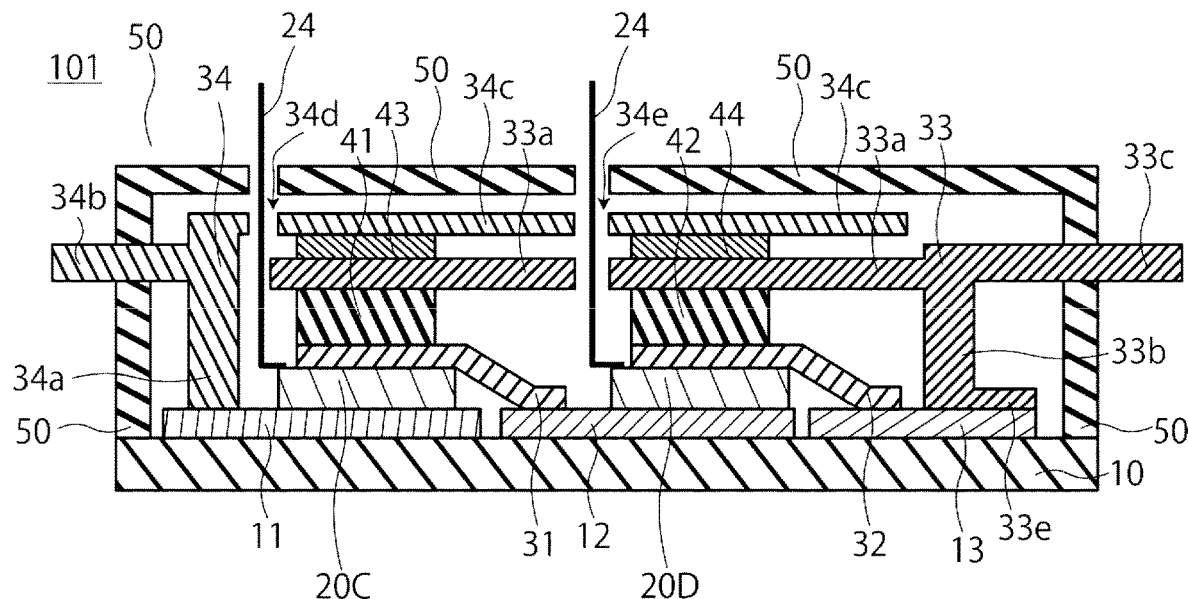
FIG. 3 is a sectional view of a semiconductor module of at least one embodiment.

A second embodiment relates to a semiconductor module. FIG. 3 shows a sectional view of a semiconductor module 101 of the second embodiment. The semiconductor module 101 of the second embodiment differs from the semiconductor module 100 of the first embodiment in the following points. That is, resin-unsealed bare chips or semiconductor elements 20C and 20D are used as a first semiconductor device 20C and a second semiconductor device 20D, instead of the semiconductor devices having the resin-sealed semiconductor elements. A plate part 34c is provided to the fourth wiring 34 so that heat from the semiconductor elements 20C and 20D will be transferred to the substrate 10 via the fourth wiring 34. The contents of the semiconductor module 101 of the second embodiment that are the same as those of the semiconductor module 100 of the first embodiment are not described.

The bare chips 20C and 20D, which are not sealed with insulating resin, are accordingly thinner than the first semiconductor device 20A and the second semiconductor device 20B. Thus, the package height of the semiconductor module 101 can be low. At least one embodiment shows an example of a higher heat dissipating package in which the plate part 34c is provided to the fourth wiring 34 instead of lowering the package height.

A surface on a side of the substrate 10 of the first semiconductor device 20C of the bare chip semiconductor element is a first surface, whereas a surface opposite to the first surface of the bare chip of the first semiconductor device 20C is a second surface of the first semiconductor device 20C. A first electrode and a second electrode are respectively provided to the first surface and the second surface of the first semiconductor device 20C.

A surface on a side of the substrate 10 of the second semiconductor device 20D of the bare chip semiconductor element is a first surface of the second semiconductor device 20D, whereas a surface opposite to the first surface of the bare chip of the second semiconductor device 20D is a second surface of the second semiconductor device 20D. A first electrode and a second electrode are respectively pro-vided to the first surface and the second surface of the second semiconductor device 20D.

The semiconductor module 101 has a third intermediate layer 43 and a fourth intermediate layer 44.

The plate part 34c of the fourth wiring 34 extends in the X-Y plane direction above the plate part 33a of the third wiring 33. The plate part 33a is provided with openings 34d and 34e. The opening 34d allows the third electrode 24 of the first semiconductor device 20C to pass therethrough. The opening 34e allows the third electrode 24 of the second semiconductor device 20D to pass therethrough.

The third intermediate layer 43 is positioned between the plate part 33a of the third wiring 33 on the first intermediate layer 41 and the plate part 34c of the fourth wiring 34. The third intermediate layer 43 is thermally coupled to the plate part 33a of the third wiring 33 on the first intermediate layer 41 and to the plate part 34c of the fourth wiring 34. Heat that is transferred from the first semiconductor device 20C and the second semiconductor device 20D to the third wiring 33 is then transferred to the fourth wiring 34 via the third intermediate layer 43 and is dissipated from the fourth wiring 34 via a back surface of the substrate 10.

The fourth intermediate layer 44 is positioned between the plate part 33a of the third wiring 33 on the second intermediate layer 42 and the plate part 34c of the fourth wiring 34. The fourth intermediate layer 44 is thermally coupled to the plate part 33a of the third wiring 33 on the second intermediate layer 42 and to the plate part 34c of the fourth wiring 34. Heat that is transferred from the first semiconductor device 20C and the second semiconductor device 20D to the third wiring 33 is then transferred to the fourth wiring 34 via the fourth intermediate layer 44 and is dissipated from the fourth wiring 34 via the back surface of the substrate 10.

Providing the third intermediate layer 43 and the fourth intermediate layer 44 form a path for allowing heat that is transferred to the third wiring 33, to be transferred from the fourth wiring 34 to the substrate 10. Accordingly, this structure facilitates better cooling of the semiconductor devices and increases reliability of the semiconductor module 101.

Third Embodiment

Figure 4:
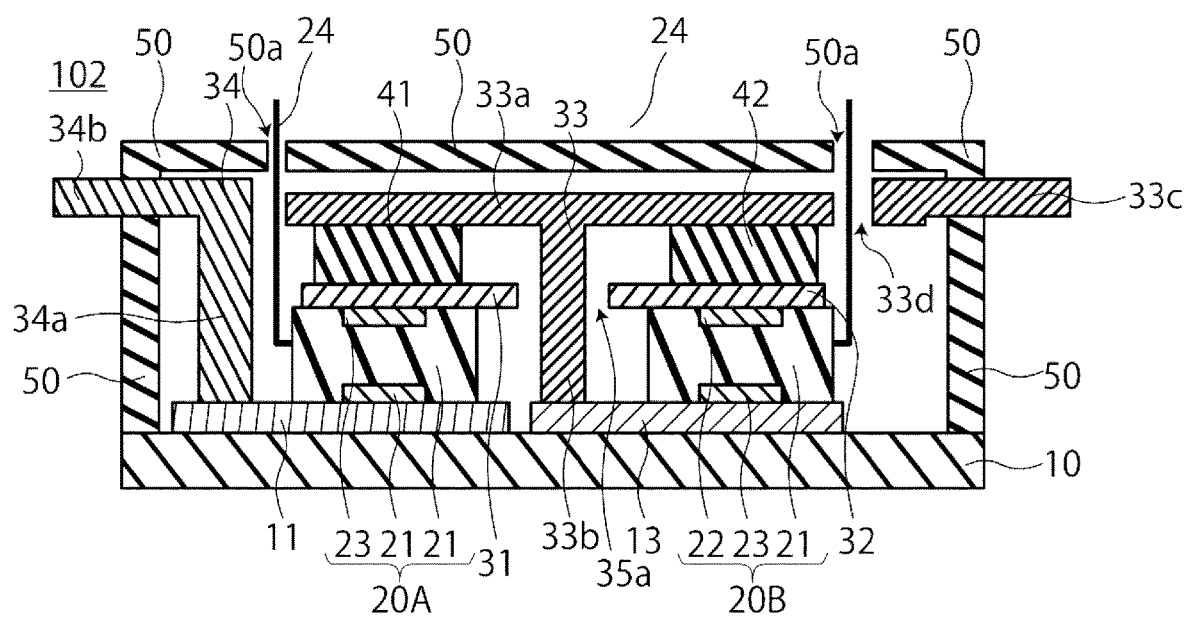
FIG. 4 is a sectional view of a semiconductor module of at least one embodiment.

A third embodiment relates to a semiconductor module. FIG. 4 shows a sectional view of a semiconductor module 102 of the third embodiment. The semiconductor module 102 of the third embodiment differs from the semiconductor module 100 of the first embodiment in the following points. That is, the second semiconductor device 20B is disposed in such a manner as to have the second electrode 23 on the first surface on the side of the substrate 10 of the second semiconductor device 20B and to have the first electrode 22 on the second surface on the side opposite to the first surface. The first wiring 31 and the second wiring 32 are coupled to each other in such a manner that an opening 35 is provided. The coupled first wiring 31 and second wiring 32 are coupled to the second electrode 23 of the first semiconductor device 20A and to the first electrode 22 of the second semiconductor device 20B. The second electrode 23 of the second semiconductor device 20B is coupled to the third wiring 33 via the wiring layer 13. The pillar part 33b or the wall part 33b of the third wiring 33 passes through the opening 35. The contents of the semiconductor module 102 of the third embodiment that are the same as those of the semiconductor modules 100 and 101 of the first embodiment and the second embodiment are not described.

The semiconductor module 102 of the third embodiment is an implementation in which the second semiconductor device 20B is mounted in such a manner as to be an inverted first semiconductor device 20A. In the first embodiment, the first semiconductor device 20A and the second semiconductor device 20B have the same polarities on the same side. On the other hand, the third embodiment shows a case in which the semiconductor devices are mounted so as to have polarities opposite to each other on the same side. The third embodiment is an implementation in which heat that is generated from the semiconductor device is dissipated from the substrate 10 via the third wiring 33 in this case.

In the third embodiment, the semiconductor devices may be mounted so as to have polarities opposite to each other on the same side, and the first wiring 31 and the second wiring 32 are coupled to each other. The coupled member of the first wiring 31 and the second wiring 32 performs the role of the wiring layer 12, whereby the first semiconductor device 20A and the second semiconductor device 20B are electrically connected to each other without passing through the wiring layers on the substrate 10.

The pillar part 33b or the wall part 33b of the third wiring 33 passes through the opening 35 of the first wiring 31 and the second wiring 32, which are coupled to each other, and the pillar part 33b or the wall part 33b is electrically connected to the second electrode 23 of the second semiconductor device 20B via the wiring layer 13, which is provided on the substrate 10. Heat that is transferred through the third wiring 33 is thus dissipated from the substrate 10.

The first electrode 22 of the second semiconductor device 20B is coupled to the second wiring 32. The first wiring 31 and the second wiring 32, which are coupled to each other, electrically connect the second electrode 23 of the first semiconductor device 20A and the first electrode 22 of the second semiconductor device 20B to each other.

The first intermediate layer 41 is positioned between the second electrode 23 of the first semiconductor device 20A and the third wiring 33, as in the first embodiment. The first intermediate layer 41 is thermally coupled to the second electrode 23 of the first semiconductor device 20A and to the third wiring 33. The second intermediate layer 42 is positioned between the first electrode 22 of the second semiconductor device 20B and the third wiring 33. The second intermediate layer 42 is thermally coupled to the first electrode 22 of the second semiconductor device 20B and to the third wiring 33.

As in the first embodiment and other embodiment, and also in the third embodiment, heat is transferred by the first intermediate layer 41 and the second intermediate layer 42 without providing additional space to the substrate 10. This structure facilitates cooling the semiconductor devices and increases reliability of the semiconductor module 102.

Fourth Embodiment

Figure 5:
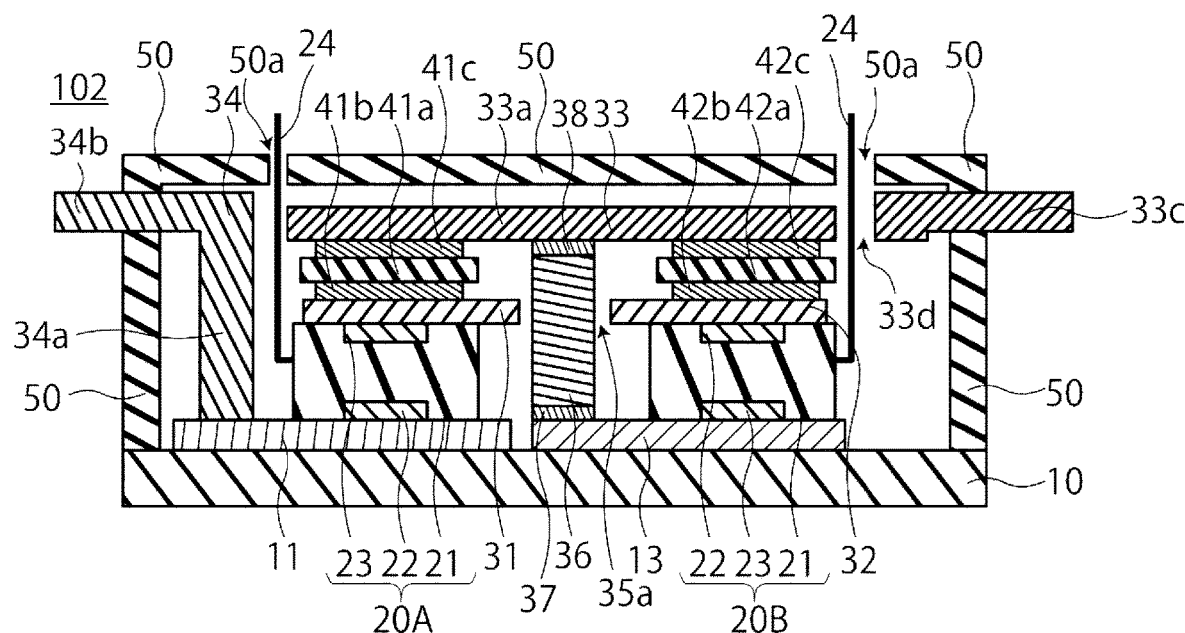
FIG. 5 is a sectional view of a semiconductor module of at least one embodiment.

A fourth embodiment relates to a semiconductor module. FIG. 5 shows a sectional view of a semiconductor module 103 of the fourth embodiment. The semiconductor module 103 of the fourth embodiment differs from the semiconductor module 102 of the third embodiment in the following points. That is, the pillar part 33b or the wall part 33b is not disposed in the third wiring 33, but a pillar-shaped or wall-shaped fifth wiring 36 couples the third wiring 33 and the wiring layer 13 to each other. The first intermediate layer 41 has a stacked structure of a first metal layer 41b, a ceramic layer 41a or an insulating thermally conductive resin layer 41a or both, and a second metal layer 41c. The second intermediate layer 42 has a stacked structure of a third metal layer 42b, a ceramic layer 42a or an insulating thermally conductive resin layer 42a or both, and a fourth metal layer 42c. The contents of the semiconductor module 103 of the fourth embodiment that are the same as those of the semiconductor modules 100, 101, and 102 of the first to the third embodiments are not described.

The third wiring 33 without the pillar part 33b or the wall part 33b is used, and the pillar-shaped or wall-shaped fifth wiring 36 is provided between the third wiring 33 and the wiring layer 13 on the substrate 10. Thus, the fifth wiring 36 electrically connects the third wiring 33 and the second electrode 23 of the second semiconductor device 20B to each other. In the case of providing the pillar part 33b or the wall part 33b to the third wiring 33, the shape of the pillar part 33b or the wall part 33b may be limited due to processing constraints. In such situations, it is preferable to prepare a pillar part 33b or wall part 33b that has a largely protruding part as another member and to join it to the third wiring 33 and to the wiring layer 13. This embodiment uses the fifth wiring 36 as the other member. The fifth wiring 36 is preferably joined to the third wiring 33 and to the wiring layer 13 by forming bonding layers 38 and 37 with the use of solder or conductive paste.

The first intermediate layer 41 preferably has a stacked structure of the first metal layer 41b, the ceramic layer 41a or the insulating thermally conductive resin layer 41a or both, and the second metal layer 41c. Use of the structure having the insulating layer interposed between the metal layers enables achieving high insulating properties and high heat dissipating properties. The first metal layer 41b is preferably bonded to the first wiring 31 by solder, sintered conductive paste, or the like. The second metal layer 41c is preferably bonded to the third wiring 33 by solder, sintered conductive paste, or the like.

The second intermediate layer 42 preferably has a stacked structure of the third metal layer 42b, the ceramic layer 42a or the insulating thermally conductive resin layer 42a or both, and the fourth metal layer 42c. Use of the structure having the insulating layer interposed between the metal layers enables achieving high insulating properties and high heat dissipating properties. The third metal layer 42b is preferably bonded to the second wiring 32 by solder, sintered conductive paste, or the like. The fourth metal layer 42c is preferably bonded to the third wiring 33 by solder, sintered conductive paste, or the like.

As in the first embodiment and other embodiments, also in the fourth embodiment, heat is transferred by the first intermediate layer 41 and the second intermediate layer 42 without providing additional space to the substrate 10. This structure facilitates cooling the semiconductor devices and increases reliability of the semiconductor module 103.

Fifth Embodiment

Figure 6:
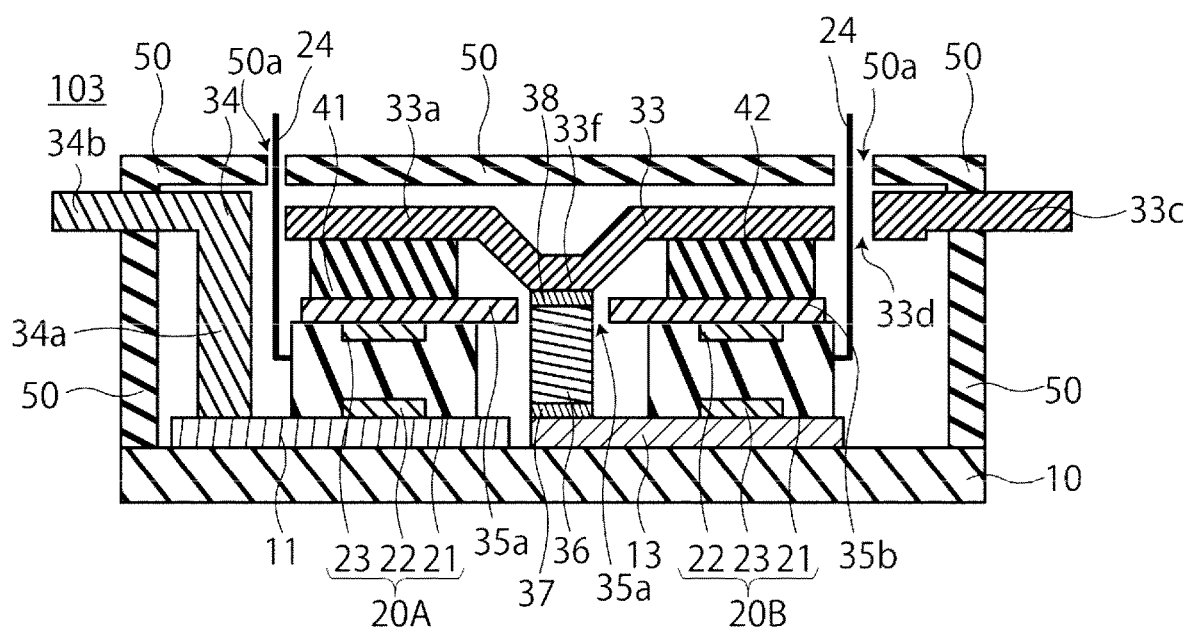
FIG. 6 is a sectional view of a semiconductor module of at least one embodiment.

A fifth embodiment relates to a semiconductor module. FIG. 6 shows a sectional view of a semiconductor module 104 of the fifth embodiment. The semiconductor module 104 of the fifth embodiment differs from the semiconductor module 103 of the fourth embodiment in the following point. That is, a protrusion that protrudes to the fifth wiring 36 is disposed at a part coupled to the fifth wiring 36 of the plate part 33a. The contents of the semiconductor module 104 of the fifth embodiment that are the same as those of the semiconductor modules 100, 101, 102, and 103 of the first to the fourth embodiments are not described.

Heat is transferred to the substrate 10 via the fifth wiring 36. With this structure, the bonding layer 37 between the fifth wiring 36 and the wiring layer 13 and the bonding layer 38 between the fifth wiring 36 and the third wiring 33 tend to receive a load due to a heat cycle and can be thereby reduced in reliability. In view of this, in order to lower the height of a tall fifth wiring 36, the part coupled to the fifth wiring 36 of the plate part 33a preferably has a protrusion to the fifth wiring 36. The protrusion provides a deformed part to the third wiring 33 and facilitates eliminating distortion. The protrusion is preferably also provided from this point of view.

As in the first embodiment and other embodiments, also in the fifth embodiment, heat is transferred by the first intermediate layer 41 and the second intermediate layer 42 without providing additional space to the substrate 10. This structure facilitates cooling the semiconductor devices and increases reliability of the semiconductor module 104.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor module comprising:
a substrate;
a first semiconductor device provided on the substrate, the first semiconductor device having a first surface facing the substrate and having a second surface opposite to the first surface;
a second semiconductor device provided on the substrate, the second semiconductor device having a first surface facing the substrate and having a second surface opposite to the first surface;
a first wiring provided on the second surface of the first semiconductor device and coupled to the second surface of the first semiconductor device;
a second wiring provided on the second surface of the second semiconductor device and coupled to the second surface of the second semiconductor device;
a first intermediate layer provided on and coupled to the first wiring;
a second intermediate layer provided on and coupled to the second wiring; and
a third wiring having (i) a plate part on and coupled to the first intermediate layer and on the second intermediate layer, and (ii) a pillar part or a wall part between the plate part and the substrate coupling the plate part and the substrate.

2. The semiconductor module according to claim 1, wherein the first intermediate layer has a thermal conductivity of 3 W/mK or greater,
the first intermediate layer is electrically insulating in a direction from the first wiring to the third wiring such that the first wiring and the third wiring are not electrically connected to each other,
the second intermediate layer has a thermal conductivity of 3 W/mK or greater,
the second intermediate layer is electrically insulating in a direction from the second wiring to the third wiring such that the second wiring and the third wiring are not electrically connected to each other.

3. The semiconductor module according to claim 1, wherein the first intermediate layer includes at least one of a ceramic layer or an insulating thermally conductive resin layer, and
the second intermediate layer includes at least one of a ceramic layer or an insulating thermally conductive resin layer.

4. The semiconductor module according to claim 1, wherein the first semiconductor device has a first electrode on the first surface of the first semiconductor device,
the first semiconductor device has a second electrode on the second surface of the first semiconductor device,
the second semiconductor device has a first electrode on the first surface of the second semiconductor device,
the second semiconductor device has a second electrode on the second surface of the second semiconductor device,
the second electrode of the first semiconductor device is coupled to the first electrode of the second semiconductor device via the first wiring,
the second wiring is coupled to the third wiring,
the first intermediate layer is positioned between the second electrode of the first semiconductor device and the third wiring,
the first intermediate layer is thermally coupled to the second electrode of the first semiconductor device and to the third wiring,
the second intermediate layer is positioned between the second electrode of the second semiconductor device and the third wiring, and
the second intermediate layer is thermally coupled to the second electrode of the second semiconductor device and to the third wiring.

5. The semiconductor module according to claim 1, wherein the first semiconductor device has a first electrode on the first surface of the first semiconductor device,
the first semiconductor device has a second electrode on the second surface of the first semiconductor device,
the second semiconductor device has a second electrode on the first surface of the second semiconductor device,
the second semiconductor device has a first electrode on the second surface of the second semiconductor device,
the first wiring and the second wiring are coupled to each other such that an opening is provided,
the first wiring and the second wiring are coupled to the second electrode of the first semiconductor device and to the first electrode of the second semiconductor device,
the first electrode of the second semiconductor device is coupled to the third wiring,
the pillar part or the wall part of the third wiring passes through the opening,
the first intermediate layer is positioned between the second electrode of the first semiconductor device and the third wiring,
the first intermediate layer is thermally coupled to the second electrode of the first semiconductor device and to the third wiring,
the second intermediate layer is positioned between the first electrode of the second semiconductor device and the third wiring, and
the second intermediate layer is thermally coupled to the first electrode of the second semiconductor device and to the third wiring.

6. The semiconductor module according to claim 1, wherein the third wiring is a first external electrode terminal of the semiconductor module or is coupled to a first external electrode terminal of the semiconductor module.

7. The semiconductor module according to claim 1, wherein the first intermediate layer has a stacked structure of a first metal layer, at least one of a ceramic layer or an insulating thermally conductive resin layer, and a second metal layer, the second intermediate layer has a stacked structure of a third metal layer, a ceramic layer or an insulating thermally conductive resin layer or both, and a fourth metal layer, the first metal layer is joined to the first wiring, the second metal layer is joined to the third wiring, the third metal layer is joined to the second wiring, and the fourth metal layer is coupled to the third wiring.

8. The semiconductor module according to claim 1, wherein the first semiconductor device includes a semiconductor element that is sealed with resin, and the second semiconductor device includes a semiconductor element that is sealed with resin.

9. The semiconductor module according to claim 1, wherein the semiconductor element of the first semiconductor device is a bare chip, a surface of the bare chip of the first semiconductor device is the first surface of the first semiconductor device, a surface on a side opposite to the surface of the bare chip of the first semiconductor device is the second surface of the first semiconductor device, the semiconductor element of the second semiconductor device is a bare chip, a surface of the bare chip of the second semiconductor device is the first surface of the second semiconductor device, and a surface on a side opposite to the surface of the bare chip of the second semiconductor device is the second surface of the second semiconductor device.

10. The semiconductor module according to claim 1, wherein the substrate has a dielectric strength of 17 kV/m or more.

11. The semiconductor module according to claim 1, wherein the substrate has a thermal conductivity of 3 W/mK or more.

12. The semiconductor module according to claim 1, wherein the first intermediate layer has a dielectric strength of 17 kV/m or more.

13. The semiconductor module according to claim 1, further including a resin sealing the first semiconductor device.

14. The semiconductor module according to claim 1, wherein the first semiconductor device and the second semiconductor device are arranged in series.

15. The semiconductor module according to claim 1, wherein the first semiconductor device and the second semiconductor device are arranged in parallel.

16. The semiconductor module according to claim 3, wherein at least one of the first intermediate layer or the second intermediate layer is an insulating thermally conductive resin layer including a filler.

17. The semiconductor module according to claim 3, wherein each of the first intermediate layer and the second intermediate layer is an insulating thermally conductive resin layer including a filler.

* * * * *